United States Patent [19]
Kimura

[11] Patent Number: 5,025,420
[45] Date of Patent: Jun. 18, 1991

[54] PORTABLE SEMICONDUCTOR MEMORY DEVICE

[75] Inventor: Masatoshi Kimura, Itami, Japan

[73] Assignee: Mitsubishi Denki Kabushiki Kaisha, Japan

[21] Appl. No.: 465,497

[22] Filed: Jan. 16, 1990

[30] Foreign Application Priority Data

Nov. 2, 1989 [JP] Japan ................... 1-284855

[51] Int. Cl.⁵ .............................. G11C 11/40
[52] U.S. Cl. ..................... 365/230.01; 365/189.01
[58] Field of Search ............... 365/189.01, 230.01

[56] References Cited

U.S. PATENT DOCUMENTS 4,889,495 12/1989 Kimura ................... 439/60

Primary Examiner—Terrell W. Fears
Attorney, Agent, or Firm—Leydig, Voit & Mayer

[57] ABSTRACT

A portable semiconductor memory device includes an internal memory for storing data, an address bus, a control bus, and a data bus which are connected to the internal memory, a connector for electrically connecting the address bus, the control bus, and the data bus to terminal equipment, and a contact confirmation/control circuit which is connected to the address bus, the control bus, and the data bus and in which known data is previously stored and which outputs the known data to the data bus when a read control signal is input from the terminal equipment over the control bus and when a given address is specified on the address bus to indicate the proper connection of the memory device to the terminal equipment through the connector.

4 Claims, 5 Drawing Sheets

FIG. 3
FIG. 4
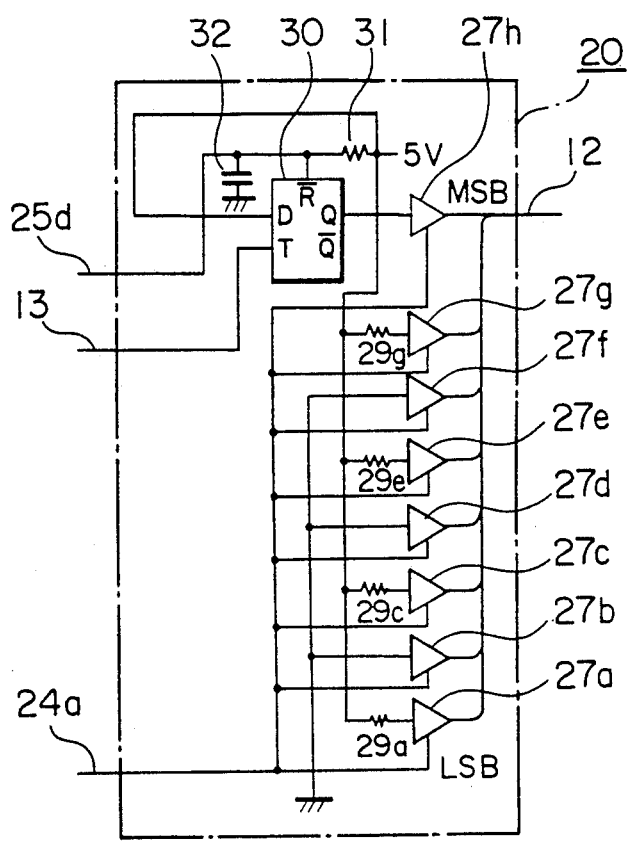
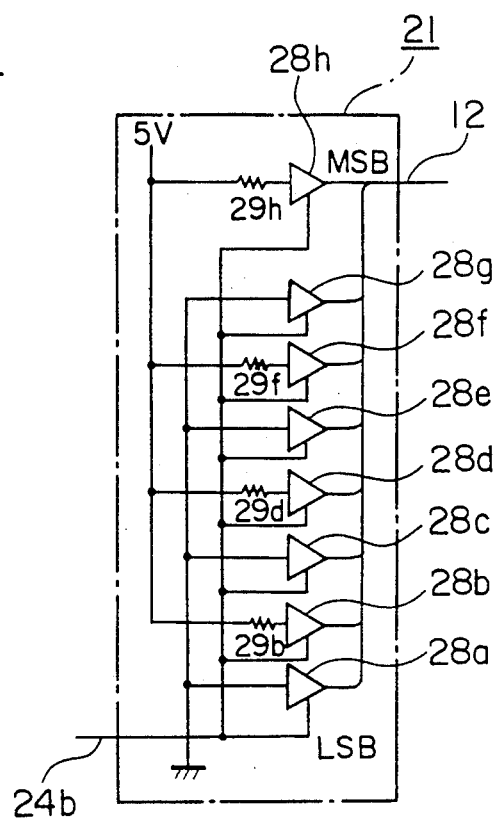

PORTABLE SEMICONDUCTOR MEMORY DEVICE

BACKGROUND OF THE INVENTION

1. Field of the Invention

The present invention relates to a portable semiconductor memory device and particularly, to a memory device which allows access to an internal memory when connected to terminal equipment through a connector.

2. Description of the Related Art

FIG. 7 shows the configuration of a circuit of a conventional portable semiconductor memory device. The memory, device has as an internal memory a static RAM 1, to which a battery 4 is connected through an internal power line 8 for supplying a voltage, a reverse charge preventing diode 6 and a current limiting resistor 5. A power input line 7 is connected to the internal power line 8 through a power control circuit 3 and to a connector 35. A buffer circuit 2 is connected to the internal power line 8, RAM 1, and the connector 35. The buffer circuit is connected to the connector 35 by an address bus 10, a control bus 11 and a data bus 12. The power control circuit 3 and the buffer circuit 2 are connected to each other by a control line 9. In the drawing, reference numeral 33 denotes a pull-up resistor connected between the internal power line 8 and the control bus 11.

When the memory device having the above-mentioned configuration is used, it is mounted on terminal equipment (not shown) through the connector 35. If a voltage greater than a defined value is applied to the power input line 7, the power control circuit 3 connects the power input line 7 and the internal power line 8 and sends a high level control signal to the buffer circuit 2 over the control line 9. This operation causes the voltage to be supplied to the RAM 1 and the buffer circuit 2 over the internal power line 8. The high level control signal brings the buffer circuit 2 into an enable (operable) state. In other words, the terminal equipment can get access to the RAM 1, i.e, reading from or writing in the RAM 1, over the address bus 10, the control bus 11 and the data bus 12. During this operation, since the potential of the internal power line 8 is set to a value higher than the potential of the positive side of the battery 4, the current of the battery 4 is not consumed.

When access to the RAM 1 is completed, and when a given power voltage is not applied to the input line 7, the power control circuit 3 detects that the voltage of the power input line 7 is less than the defined value and disconnects the power input line 7 from the internal power line 8 and sends a low level control signal to the buffer circuit 2 over the control line 9. The control signal brings the buffer circuit 2 into a disable (non-operating) state wherein any access to the RAM 1 is prohibited.

In this state, although no voltage is supplied to the RAM 1 through the power input line 7, the voltage of the battery 4 is supplied through the resistor 5 and the diode 6. Even if the memory device is removed from the terminal equipment, therefore, the data stored in the RAM 1 is not erased or lost but in the memory device.

However, since the connection between the memory device and the terminal equipment is effected through the connector 35 having many contact points, when foreign substances adhere to the contact points, when a contact point is deformed or broken or when the memory device is attached to the terminal equipment at an angle, in some cases unstable or poor contacts or contact errors occur. If writing to or reading from a given address area of the memory device is performed from the terminal equipment in these circumstances, there is danger of a malfunction. In particular, there is a danger of erasing the valuable data stored in the RAM 1. It is impossible to perfectly connect the connector 35 to accurately combine the memory device with the terminal equipment.

SUMMARY OF THE INVENTION

The present invention has been achieved with a view to resolving the above-mentioned problem, and it is an object of the present invention to provide a portable semiconductor memory device preventing any malfunction causing trouble in the connection of a connector.

A portable semiconductor memory device in accordance with the present invention comprises an internal memory for storing data, an address bus, a control bus and a data bus which are connected to the internal memory, a connector for electrically connecting the address bus, the control bus, and the data bus to terminal equipment, and a contact confirmation/control circuit connected to the address bus, the control bus the data bus and in which known data is previously stored to output the known data to the data bus when a reading control signal is input from the terminal equipment over the control bus and when a given address is specified on the address bus.

The contact confirmation/control circuit can be a full-address bus "L" coincidence circuit for determining that all the bits of the address bus are in the "L" level, a full-address bus "H" coincidence circuit for determining that all the bits of the address bus are in the "H" level, a first memory circuit for storing first known data and outputting it to the data bus through the AND output of the read control signal input from the terminal equipment and the detection signal from the full-address bus "L" coincidence circuit, and a second storage circuit for storing second known data and outputting it to the data bus through the AND output of the read control signal input from the terminal equipment and the detection signal from the full-address bus "H" coincidence circuit.

The first storage circuit may be provided with a change means for changing the level of a given bit of the first known data when a write control signal is input from the terminal equipment over the control bus.

BRIEF DESCRIPTION OF THE DRAWINGS

FIG. 3 is a drawing of the circuit of the "$55_H$" memory circuit in a contact confirmation/control circuit;

FIG. 4 is a drawing of the circuit of the "$AA_H$" memory circuit in a contact confirmation/control circuit;

DESCRIPTION OF THE PREFERRED EMBODIMENTS

Figure 1:
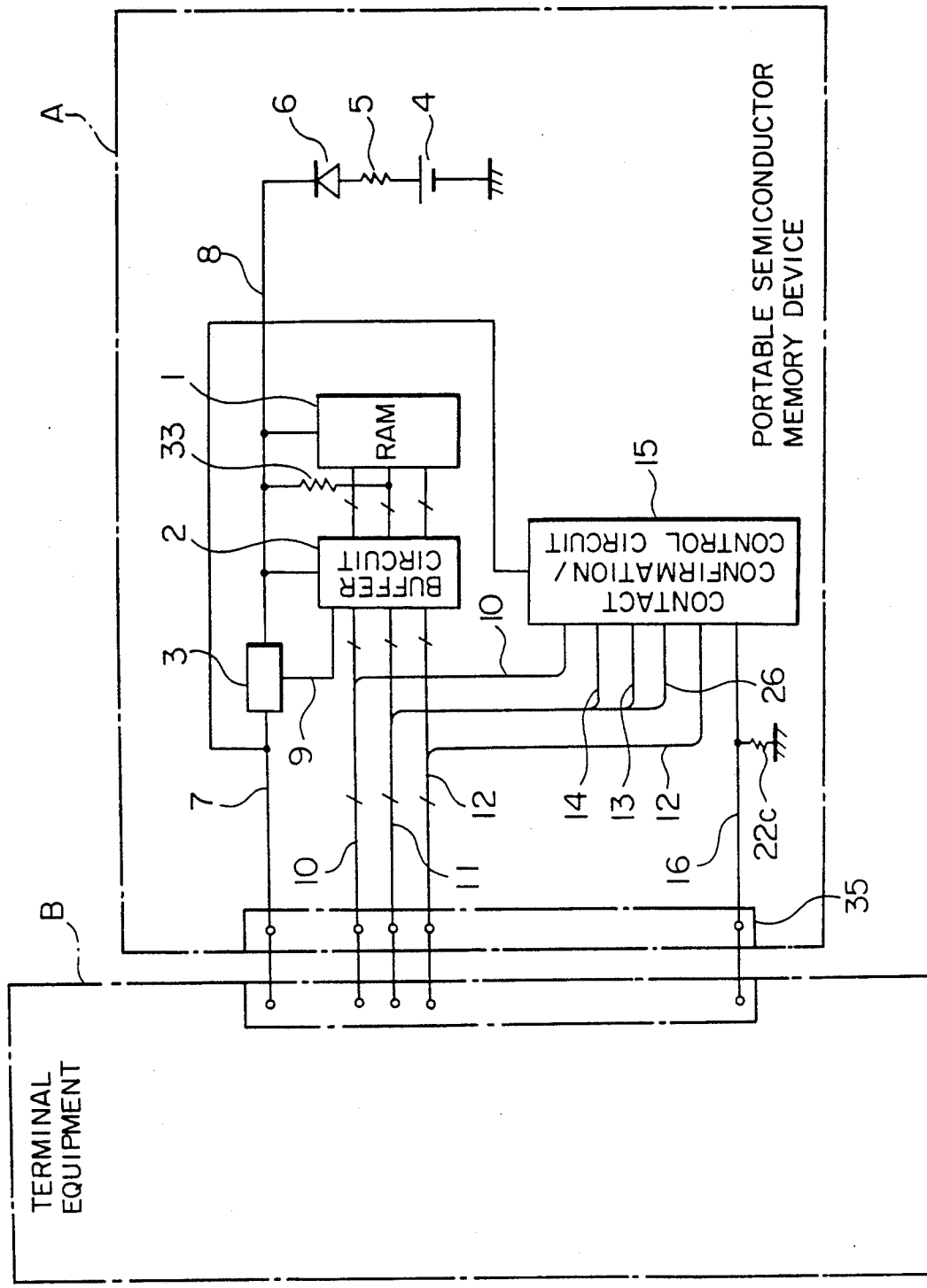
FIG. 1 is a drawing of the circuit of a portable semiconductor memory device according to an embodiment of the present invention.

In FIG. 1, a portable semiconductor memory device A has as an internal memory a static RAM 1 to which a battery 4 is connected through an internal power line 8 for supplying a voltage, a reverse charge preventing diode 6 and a current limiting resistor 5. A power input line 7 is connected to the internal power line 8 through a power control circuit 3 and to a connector 35. A buffer circuit 2 is also connected to the internal power line 8. The RAM 1 is connected to the connector 35 through the buffer circuit 2 by an address bus 10, a control bus 11, and a data bus 12. The power control circuit 3 is connected to the buffer circuit 2 by a control line 9. In the drawing, reference numeral 33 denotes a pull-up resistor which is connected between the internal power line 8 and the control bus 11.

A contact confirmation/control circuit 15 is connected to the address bus 10, the control bus 11, and the data bus 12. Specifically, each of the address bus 10 and the data bus 12 comprises a 8-bit bus, and the control bus 11 includes a write-enable signal line 13, a card-enable signal line 14, and an output-enable signal line 26. A test signal line 16 is also connected between the contact confirmation/control circuit 15 and the connector 35, and a pull-down resistance 22c is connected to the test signal line 16. The power input line 7 is connected to the contact confirmation/control circuit 15 for supplying power thereto.

Figure 7:
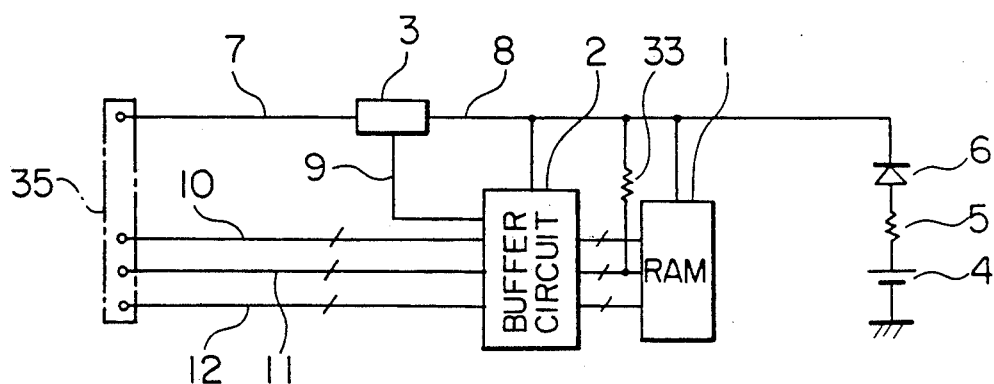
FIG. 7 is a drawing of the circuit of a conventional portable semiconductor memory device.

In the memory device in this embodiment, the contact confirmation/control circuit 15 is connected to the address bus 10, the control bus 11, and the data bus 12 which are provided in the conventional memory device shown in FIG. 7, and the test signal line 16 is connected between the connector 35 and the contact confirmation/control circuit 15, the pull-down resistor 22c being connected to the test signal line 16.

Figure 2:
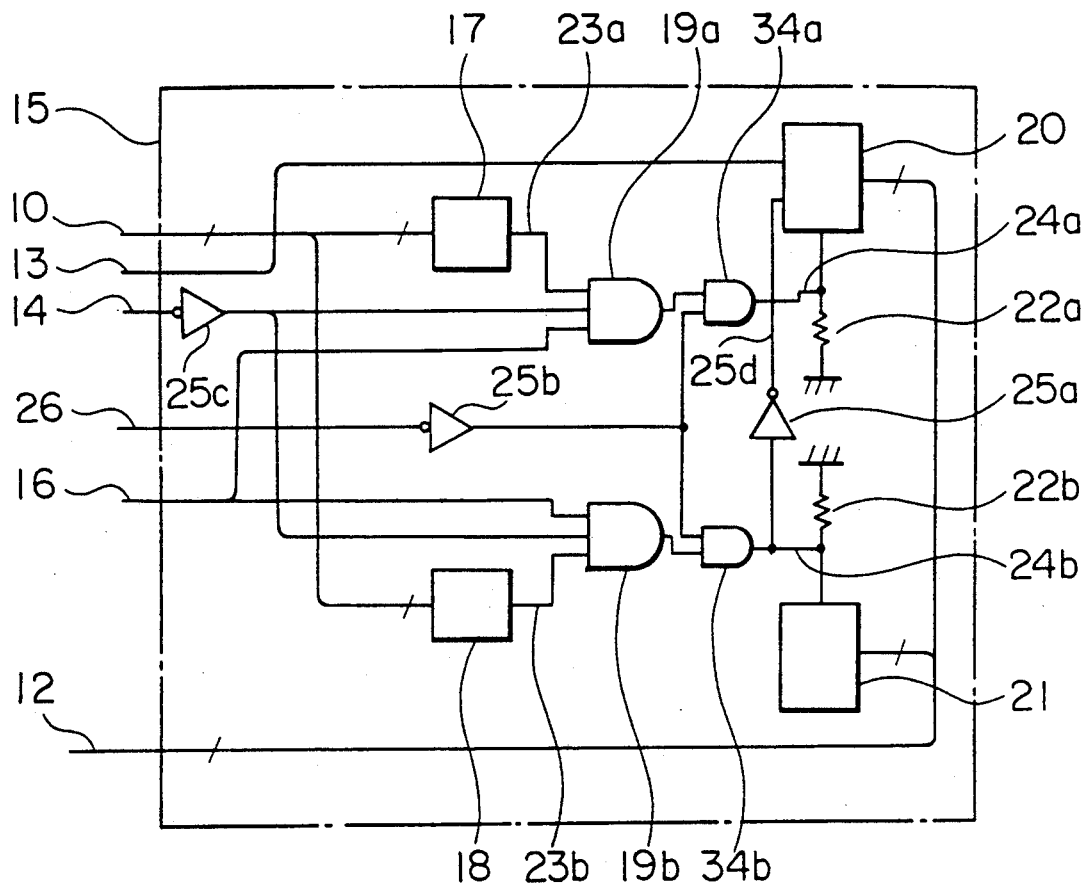
FIG. 2 is a drawing of the circuit of the contact confirmation/control circuit according to the embodiment of FIG. 1.

FIG. 2 shows the internal configuration of the contact confirmation/control circuit 15. A full-address bus "L" coincidence circuit 17 and a full-address bus "H" coincidence circuit 18 are connected to the address bus 10, the output lines 23a and 23b of the coincidence circuits 17 and 18 being connected to the first input terminals of AND circuits 19a and 19b, respectively. The full-address bus "L" coincidence circuit 17 and the full-address bus "H" coincidence circuit 18 output "H" level detection signals to the output lines 23a and 23b when all the bits of the address bus 10 are in the "L" level and the "H" level, respectively. The card-enable signal line 14 is connected to the second input terminals of the AND circuits 19a and 19b through an inverter circuit 25c, and the test signal line 16 is connected to the third input terminals of the AND circuits 19a and 19b. The output terminals of the AND circuits 19a and 19b are respectively connected to the first input terminals of AND circuits 34a and 34b, and the output-enable signal line 26 is connected to the second input terminals of the AND circuits 34a and 34b through an inverter circuit 25b.

The output lines 24a and 24b of the AND circuits 34a and 34b are respectively connected to a "$55_H$" memory circuit 20 and an "$AA_H$" memory circuit 21 as first and second memory circuits, respectively. The output line 25d of the inverter circuit 25a connected to the AND circuit 34b and the write-enable signal line 13 are connected to the "$55_H$" memory circuit 20. The data bus 12 is connected to the "$55_H$" memory circuit 20 and the "$AA_H$" memory circuit 21. In the drawing, reference numerals 22a and 22b respectively denote pull-down resistors connected to the output lines 24a and 24b of the AND circuits 34a and 34b, respectively.

As shown in FIG. 3, the "$55_H$" memory circuit 20 comprises non-inverting amplifiers 27a to 27h which respectively correspond to 8 bits from a least significant bit LSB to a most significant bit MSB of the data bus 12, pull-up resistors 29a, 29c, 29e and 29g are respectively connected to the circuits 27a, 27c, 27e and 27g of the bits in odd numbers counted from the LSB and a latch circuit 30 connected to the circuit 27h of the MSB. The latch circuit 30 forms a change means in which a 5-V power source, the output line 25d of the inverter circuit 25a, the write-enable signal line 13, and the non-inverter circuit 27h are connected to the input terminal D, the (reset) terminal $\overline{R}$, the input terminal T, and the output terminal Q, respectively. The latch circuit 30 latches to the output terminal Q the value of D input when the signal at the input terminal T rises. When the power source is turned on, since the terminal $\overline{R}$ is in the "L" level for a moment because of to the action of the resistor 31 connected to the terminal R and a reset capacitor 32, the Q output is in the "L" level.

If the "H" level 5-V potential and the "L" level which is the ground level are expressed by "1" and "0", respectively, in binary representation, therefore, the input of each of the non-inverter circuits 27a to 27h is as shown in Table 1, and "$55_H$" (first known data) is coded in hexadecimal representation.

TABLE 1

| Hexadecimal | 5 5 |
|---|---|
| Binary | 01010101 |

However, when a write-enable signal in the "H" level is input to the input terminal T of the latch circuit 30, the output terminal Q is in the "H" level. The MSB thus becomes "1", and "D5H" is coded in hexadecimal representation, as shown in Table 2.

TABLE 2

| Hexadecimal | D 5 |
|---|---|
| Binary | 11010101 |

When an "H" level signal is input from the output line 24a of the AND circuit 34a, therefore, the data indicating "$55_H$" or "$D5_H$" is output to the data bus 12.

On the other hand, as shown in FIG. 4, the "$AA_H$" memory circuit 21 comprises non-inverting amplifiers 28a to 28h which correspond to 8 bits from the LSB to the MSB of the data bus 12, and pull-up resistances 29b, 29d, 29f, and 29h which are connected to the circuits 28b, 28d, 28f and 28h of the even bits counted from the LSB. The "$AA_H$" (second known data) of the input to the non-inverter circuits 28a to 28h is coded in hexadecimal representation, as shown in Table 3.

TABLE 3

| Hexadecimal | A A |
|---|---|
| Binary | 10101010 |

When an "H" level signal is input from the output line 24b of the AND circuit 34b, data indicating "$AA_H$" in hexadecimal representation is output to the data bus 12.

The operation of this embodiment will be described below.

As shown in FIG. 1, the memory device A is connected to terminal equipment B through the connector 35. The terminal equipment B supplies a voltage to the power input line 7 of the memory device A, confirming the connection of the connector 35 in accordance with the flow chart described below and shown in FIG. 5.

Figure 6:
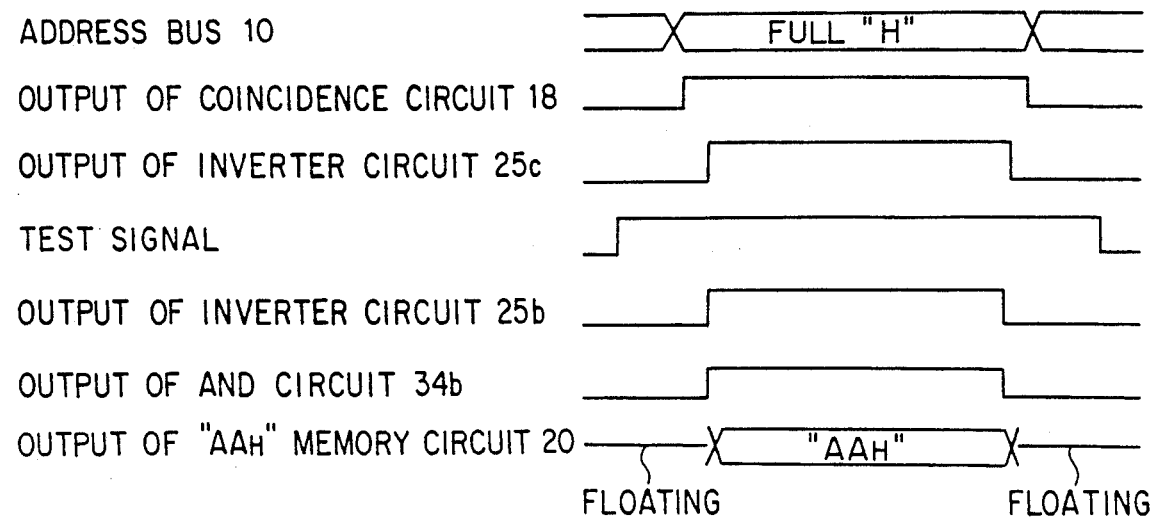
FIG. 6 is a drawing of the timing of a signal in each unit of a contact confirmation/control circuit.

In Step S1, the terminal equipment B first specifies the most significant address (all the bits are in the "H" level) in the address bus 10 while sending an "H" level test signal to the contact confirmation/control circuit 15 over the test signal line 16 and reading the most significant address by sending an "L" level control signal to each of the card-enable signal line 14 and the output-enable signal line 26 of the control bus 11. During this process, if the connector is accurately connected, in FIG. 2, since the full-address bus "H" coincidence circuit 18 outputs the "H[ level detection signal, all the first to third input terminals of the AND circuit 19b are in the "H" level, and both the first and second input terminals of the AND circuit 34b are in the "H" level. As a result, an "H" level signal is input to the "$AA_H$" memory circuit 21, and the data indicating "$AA_H$" is output to the data bus 12. FIG. 6 is a drawing which shows the timing of a signal in each unit of the contact confirmation/control circuit 15 during this process.

In Step S2, the terminal equipment B then confirms that the data read is "$AA_H$", and if the data is not "$AA_H$", it is decided in Step S3 that there is trouble in the contact of the connector 35. The "H" level signal output to the output line 24b of the AND circuit 34b is inverted by the inverter circuit 25a and then input to the terminal $\overline{R}$ of the latch circuit 30 of the "$55_H$" memory circuit 20 so that the latch circuit 30 is reset, with the output terminal Q being in the "L" level.

On the other hand, when it is confirmed that the data read in Step S2 is "$AA_H$", in Step S4, the terminal equipment B specifies again the least significant address (all the bits are in the "L" level) in the address bus 10 while sending an "H" level test signal to the contact confirmation/control circuit 15 over the test signal line 16 and reading the least significant address by sending an "L" level control signal to each of the card-enable signal line 14 and the output-enable signal line 26 of the control bus 11. During this process, if the connector is accurately connected, since the full-address bus "L" coincidence circuit 17 outputs an "H" level detection signal, all the first to third input terminal of the AND circuit 19a are in the "H" level, and both of the first and second input terminals of the AND circuit 34a are in the "H" level. As a result, the "H" level of signal is input to the "$55_H$" memory circuit 20, and the data indicating "$55_H$" is output to the data bus 12. During this process, since the output from the AND circuit 34b is in the "L" level, the output from the "$AA_H$" memory circuit 21 is floating, and thus the data and memory circuit output do not collide.

In Step S5, the terminal equipment B confirms that the data read is "$55_H$", and if the data is not "$55_H$", it is decided in Step S3 that there is trouble in the contact of the connector 35. On the other hand, if is confirmed that the data is "$55_H$", in Step S6, pseudo writing is performed by outputting an "H" level pulses to the write-enable signal line 13. In other words, the Q output becomes the "H" level at the rise of the write-enable signal which is input to the input terminal T of the latch circuit 30 of the "$55_H$" memory circuit 20 whereby "$D5_H$" is coded.

In Step S7, the least significant address is then read in the same way as in Step S4. In Step S8, the terminal equipment B confirms that the read data is "$D5_H$", and if the data is not "$D5_H$", it is decided in Step S3 that there is trouble in the contact of the connector 35. While if it is confirmed that the data is "$D5_H$", it is decided in Step S9 that the connector 35 is accurately connected, and access to the RAM 1 of the memory device A shown in FIG. 1 is obtained. Although the access to the RAM 1 is obtained when the test signal of the test signal line 16 is in the "L" level, the access is the same as the access to the conventional memory device shown in FIG. 7 and is not described below.

Figure 5:
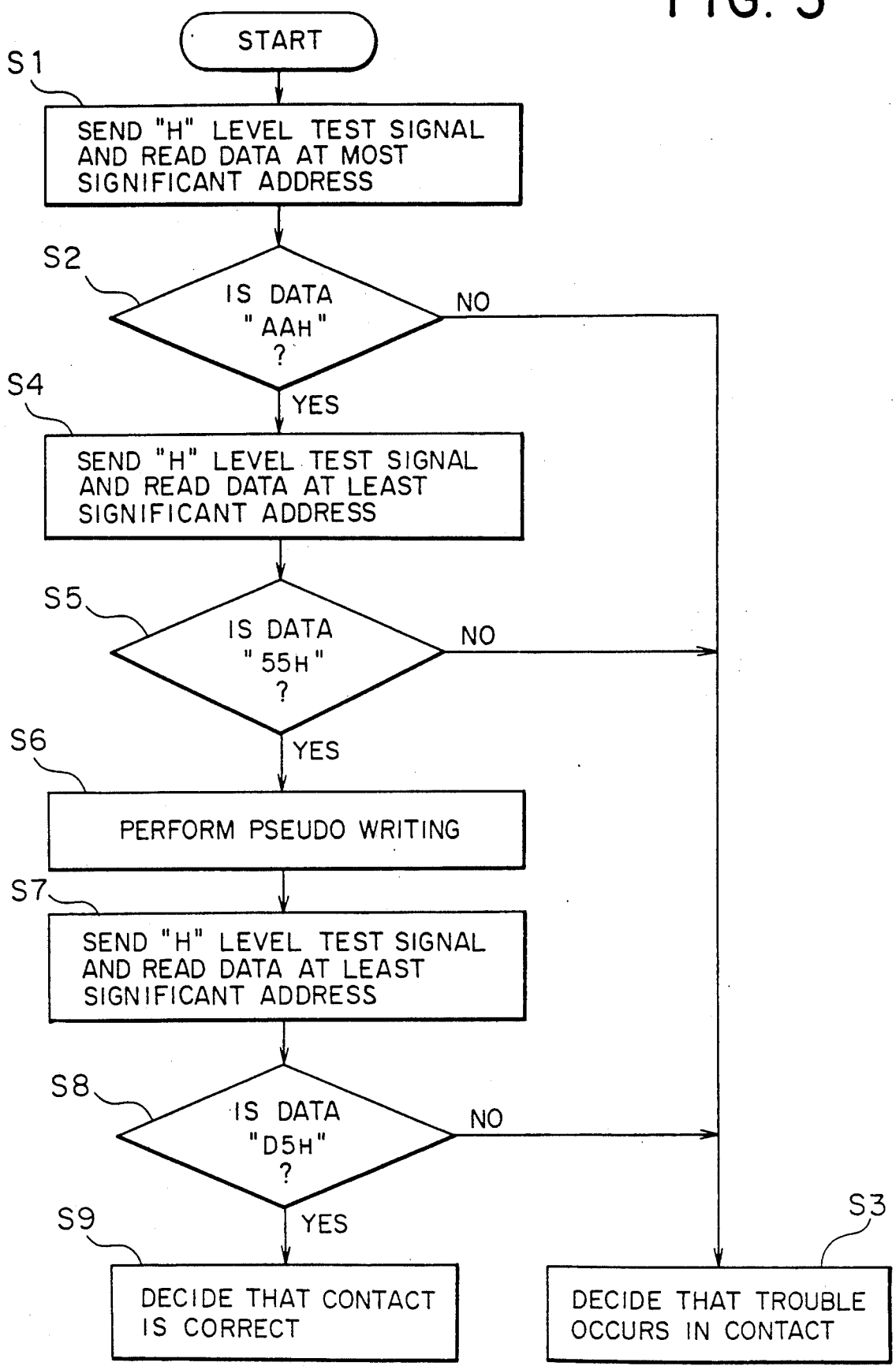
FIG. 5 is a flow chart which shows the operation of a confirming contact.

When there is trouble in the contact of the connector 35, in Step S3, after an attempt has been made to remove the cause of the trouble in the contact and the connector 35 has been connected again, the contact is confirmed again in accordance with the flow chart shown in FIG. 5.

As described above, it is possible to confirm the "H" level state and the "L" level state of each of the bits of the address bus 10 and the data bus 12, as well as confirming the contact of each of the signal lines 13, 14, and 26 of the control bus 11 by reading and pseudo writing. When the RAM 1 of the memory device A is accessed, since the test signal is in the "L" level, the data and text signal does not collide on the data bus 12.

An address bus of more significance than the address bus required for accessing to the RAM 1 or an input/output port may be utilized as the test signal line 16 in place of an independent signal line as the test signal line 16.

The full-address bus "L" coincidence circuit 17 and the full-address bus "H" coincidence circuit 18 can be easily constructed by using OR circuits, NOR circuits, AND circuits, digital comparators, or the like.

Although the data bus 12 comprises 8 bits, even if it comprises 16 bits or another number of bits, the same memory device can be formed.

The contact confirmation/control circuit 15 may be constructed by using general ICS or dedicated IC or may be incorporated in a dedicated IC together with the buffer circuit 2.

The first and second known data are not limited to "$55_H$" and "$AA_H$", other data values may be used.

The internal memory may be a semiconductor memory other than the static RAM 1. When a nonvolatile memory is used as the internal memory, the battery 4, the current limiting resistor 5, and the reverse charge preventing diode 6 which are provided for maintaining data storage without external power are not required.

What is claimed is:

1. A portable semiconductor memory device comprising:
   an internal memory for storing data;
   an address bus, a control bus, and a data bus which are connected to said internal memory;
   a connector for electrically connecting said address bus, said control bus, and said data bus to terminal equipment; and
   a contact confirmation/control circuit connected to said address bus, said control bus, and said data bus and storing at least one known digital data word for outputting the known digital data word to said data bus when a read control signal input to said contact confirmation/control circuit from the terminal equipment over said control bus with a given address specified on said address bus is received, thereby indicating proper connection of said connector to the terminal equipment and for not outputting the known data word to said data bus when a read control signal is input from the terminal equipment over said control bus with a given address is specified on said address bus but is not received, thereby indicating trouble in the connection of said connector to the terminal equipment.

2. A memory device according to claim 1 wherein said contact confirmation/control circuit comprises a full-address bus "L" coincidence circuit for detecting that all the bits of said address bus are in the "L" state, a full-address bus "H" coincidence circuit for detecting that all the bits of said address bus are in the "H" state, a first memory circuit for storing first known data and outputting said first known data to said data bus when said read control signal input from said terminal equipment and the detection signal of said full-address bus "L" coincidence circuit are in the "H" state, and a second memory circuit for storing second known data and outputting said second known data to said data bus when said read control signal input from said terminal equipment and the detection signal of said full-address bus "H" coincidence circuit are in the "H" state.

3. A memory device according to claim 2 comprising means in said first memory circuit for changing the state of a particular bit of said first known data when a write control signal is input from said terminal equipment over said control bus.

4. A memory device according to claim 1, wherein said internal memory is a volatile memory.

* * * * *